United States Patent [19]

Ehara

[11] Patent Number: 5,097,298
[45] Date of Patent: Mar. 17, 1992

[54] BLUE LIGHT EMITTING DISPLAY ELEMENT

[75] Inventor: Shaw Ehara, Nara, Japan

[73] Assignee: Sharp Kabushiki Kaisha, Osaka, Japan

[21] Appl. No.: 620,455

[22] Filed: Nov. 30, 1990

Related U.S. Application Data

[63] Continuation of Ser. No. 384,868, Jul. 21, 1989, abandoned, which is a continuation of Ser. No. 224,663, Jul. 27, 1988, abandoned.

[30] Foreign Application Priority Data

Aug. 5, 1987 [JP] Japan .................................. 62-195635

[51] Int. Cl.⁵ ...................... H01L 29/14; H01L 31/06
[52] U.S. Cl. .......................................... 357/17; 357/2; 357/16; 357/10; 357/61
[58] Field of Search .................... 357/2, 16, 17, 61, 59, 357/10

[56] References Cited

U.S. PATENT DOCUMENTS

| | | | |
|---|---|---|---|
| 3,207,939 | 9/1965 | Mason | 357/17 |
| 3,330,983 | 7/1967 | Cusano et al. | 357/17 |
| 3,488,542 | 1/1970 | Lehrer et al. | 357/17 |
| 3,683,240 | 8/1972 | Pankove | 357/17 |
| 4,081,764 | 3/1978 | Christmann et al. | 357/10 |
| 4,409,605 | 10/1983 | Ovshinsky et al. | 357/2 |
| 4,650,558 | 3/1987 | Frank | 204/242 |

FOREIGN PATENT DOCUMENTS 0096509 12/1983 European Pat. Off. ............... 357/17

Primary Examiner—Jerome Jackson, Jr.
Attorney, Agent, or Firm—Morrison & Foerster

[57] ABSTRACT

A blue light emitting display element has a hetero p-n junction type light emitting layer formed between a semiconductor layer of a II-VI or III-V semiconducting compound having a wide energy bandgap and a highly electroconductive amorphous silicon type semiconductor layer which is of opposite conduction type and capable of forming a substantially ohmic contact with the semiconducting compound.

12 Claims, 2 Drawing Sheets

● Electron
○ Hole

BLUE LIGHT EMITTING DISPLAY ELEMENT

This is a continuation of application Ser. No. 384,868 filed July 21, 1989, now abandoned, which is a continuation, of application Ser. No. 224,663 filed July 27, 1988 abandoned.

BACKGROUND OF THE INVENTION

This invention relates to a blue light emitting display element and more particularly to a blue light emitting display element with a hetero p-n junction suited for emission of light by injection of only a small amount of carriers and their recombination.

Need for blue light emitting diodes has been well recognized but there is yet no commercially available blue light emitting diode with high efficiency which can be mass-produced. Elements having only a p-n junction of SiC and blue light emitting diodes with MIS diode structure by MIS junction of GaN have been successfully developed but light emission efficiency is low with both. Mass-producibility is particularly poor with the former and neither has enjoyed wide commercial acceptance.

In general, it is difficult to produce single crystals and junctions with SiC because its single crystals are difficult to grow and its melting point is high. It is of an indirect transition type and its light emission efficiency is less than 0.1%. As for GaN, only n-type conductive crystals can generally be produced and p-n junctions with which high light emission efficiency may be anticipated cannot be formed. For this reason, MIS diode structures are used with GaN but the light emission efficiency is equally low.

Although several semiconductors with a wide energy bandgap are found among II-VI semiconducting compounds such as ZnS, ZnSe and ZnO and III-V semiconducting compounds such as GaN, AlN and AlP, it is difficult by adding a dopant to produce a semiconductor which can be both p and n type. A small number of carriers are injected by tunnel effect in an MIS structure but the problem of low light emission efficiency still remains as a result.

SUMMARY OF THE INVENTION

It is therefore an object of the present invention to provide a blue light emitting display element with improved light emission efficiency.

The above and other objects of the present invention are achieved by providing a blue light emitting display element having as its light emitting part a hetero p-n junction type light emitting layer composed of a semiconductor layer of a first conduction type comprising a II-VI or III-V semiconducting compound having a wide energy bandgap and a highly electroconductive amorphous silicon-type semiconductor layer of a second conduction type (opposite from the first conduction type) which can form a substantially ohmic contact with the aforementioned semiconducting compound and is stacked on the semiconductor layer.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE INVENTION

Figure 1:
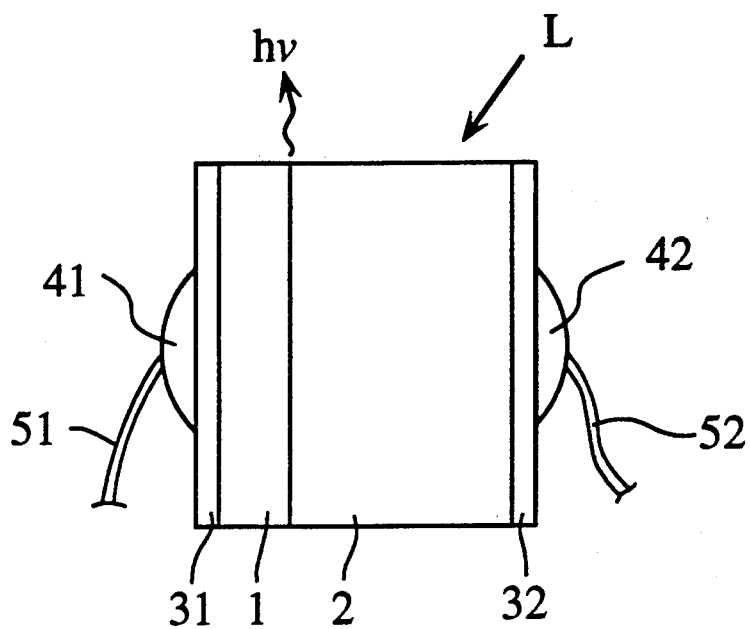
FIG. 1 is a drawing schematically showing the structure of a blue light emitting display element embodying the present invention.

According to the present invention, a hetero p-n junction is produced by forming on the surface of a semiconductor layer having a wide energy bandgap a highly conductive amorphous silicon type layer of opposite conduction type to that of the semiconductor layer and a small number of carriers are injected into the semiconductor layer.

Examples of II-VI semiconducting compounds having a wide energy bandgap $E_{gn}$ usable according to the present invention include ZnO ($E_{gn}=3.2eV$), ZnS ($E_{gn}=3.54eV$) and ZnSe ($E_{gn}=2.58eV$). Examples of III-V semiconducting compound layer include GaN, AlN and AlP. The semiconducting compound for the purpose of the present invention need only to have high purity and good crystallinity. Use may be made of those of which conduction type has been determined automatically by lattice defects or those to which a dopant has been added to introduce electroconductivity. Examples of amorphous silicon type semiconductor include aSi:H type alloys such as aSiGe:H, aSi:H, aSiN:H and aSi$_{1-x}$C$_x$:H. Examples of semiconductors of p conduction type include aSiGeB:H, aSi:H(B), aSiN:H(B) and aSi$_{1-x}$C$_x$:H(B) but it is particularly preferable to use aSiGeB:H with high electroconductivity (resistance less than $10^{-3}\Omega cm$). The doping rate of B is preferably 0.01-3% and more preferably about 0.5%. Examples of p-type dopant besides B include Al, Ga and In. Examples of n-type dopant include P, As and Sb.

According to the present invention, a substantially ohmic contact is formed between a conductive aSi:H type alloy and a semiconducting compound having a wide energy bandgap. This means, for example, that aSiGeB:H which has a high carrier number and exhibits metal-like conductivity and n-type ZnO which has a high level density at the junction can form a hetero junction and an ohmic contact, allowing the carriers to pass by the tunnel effect through the Schottkey barrier formed by n-type ZnO by making the width of this barrier thinner. For the purpose of this invention, resistance of the conductive aSi:H type alloy should preferably be $1\Omega cm$ or less and more preferably $1m\Omega cm$ or less.

The thickness of the layer of conductive aSi:H type alloy of the hetero p-n junction type light emitting layer of the present invention should preferably be 0.1-10μm and more preferably about 1 μm. The thickness of the semiconducting compound should preferably be 1-100 μm and more preferably about 10 μm. A plasma chemical vapor deposition method of a known kind may be used to form the conductive layer of aSi:H type alloy on the semiconducting compound layer. In this case, the substrate temperature should preferably be 150°-300° C. and more preferably about 200° C.

In a hetero p-n junction type light emitting layer of the present invention, dangling bonds generated at the junction boundary surface are saturated by hydrogen because one side of this boundary surface is in a hydrogenated amorphous condition. As a result, formation of energy levels at the boundary surface by the dangling bonds are reduced and, if a potential is applied in the normal direction, electrons may be captured by these few levels at the boundary surface to form a barrier but since the barrier thus formed is thin in width and low in height, it is not capable of preventing the injection of carriers.

In general, if a p-n junction is formed with different materials, their difference in work function and electrical affinity causes formation of notches (hills) at junctions of conduction bands and dips (valleys) in filled bands which tend to serve as a sharp barrier effectively preventing the injection of carriers. According to the present invention, this problem can be eliminated by wide indefinite edge portions of an amorphous silicon type semiconductor layer. Moreover, since energy bandgaps of an amorphous silicon type semiconductor layer can be freely controllable by adding a dopant, a heterojunction can be formed by freely selecting an ideal bandgap. Thus, it is possible to prevent step-wise differences from being formed in conductive bands or filled bands to prevent the injection of carriers or emission of light with mixed colors corresponding to different bandgaps instead of a monochromatic blue beam of light. In summary, effective carriers can be injected according to the present invention and monochromatic blue light can be obtained by recombination of carriers.

Figure 2:
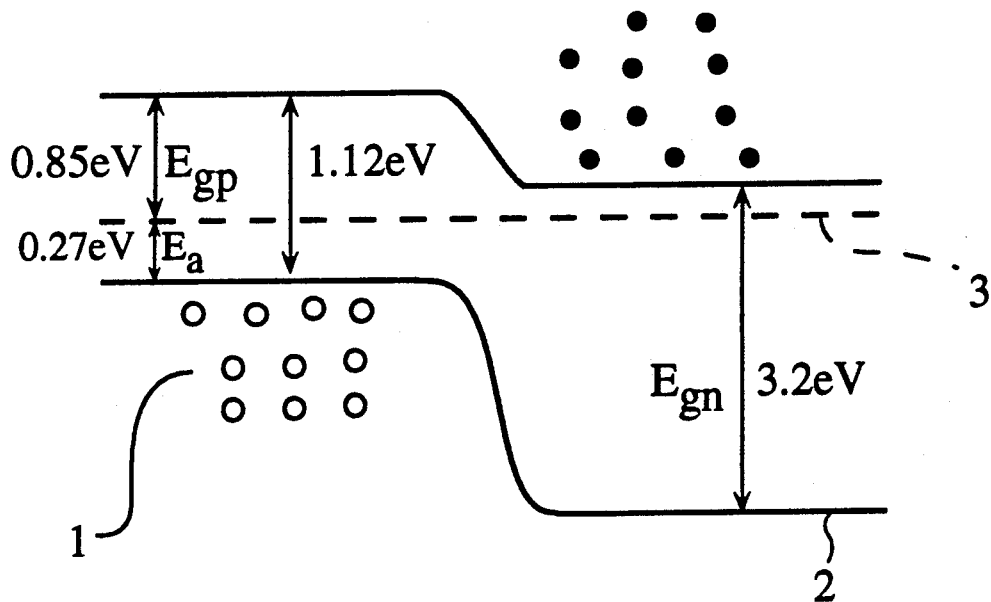
FIG. 2 is an energy diagram of the hetero p-n junction type light emitting layer of the element of FIG. 1 when it is joined.
Figure 3:
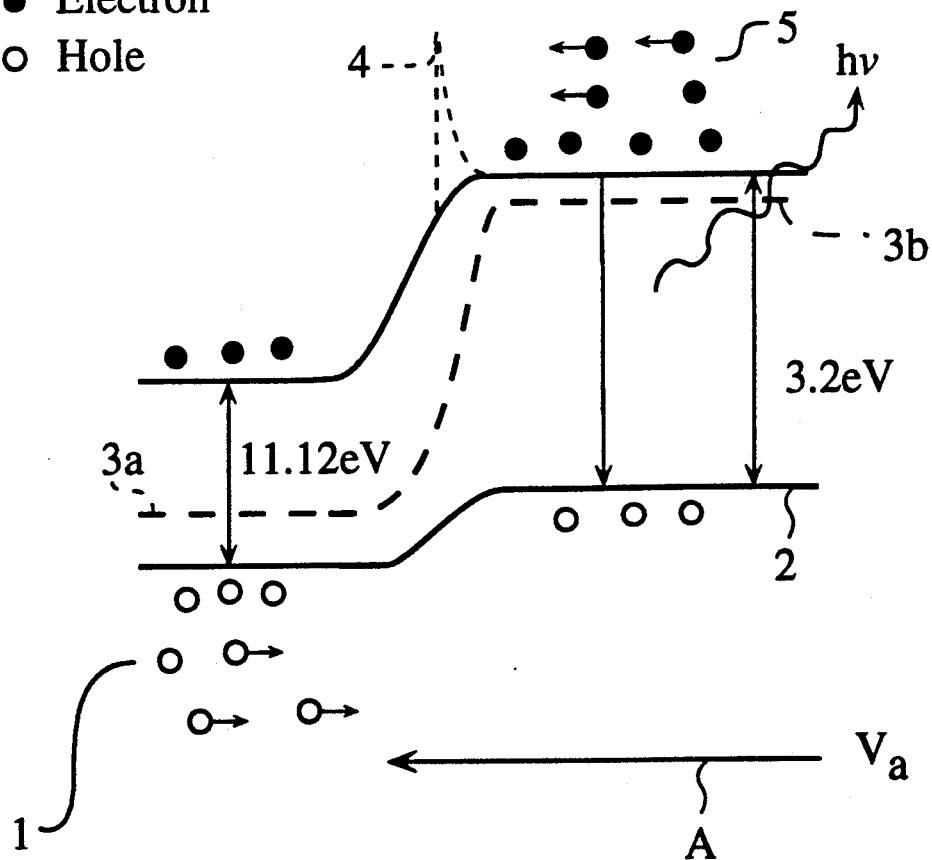
FIG. 3 is an energy diagram showing the phenomenon in the light emitting layer of FIG. 2 when a voltage is applied to it in normal direction.
Figure 2:
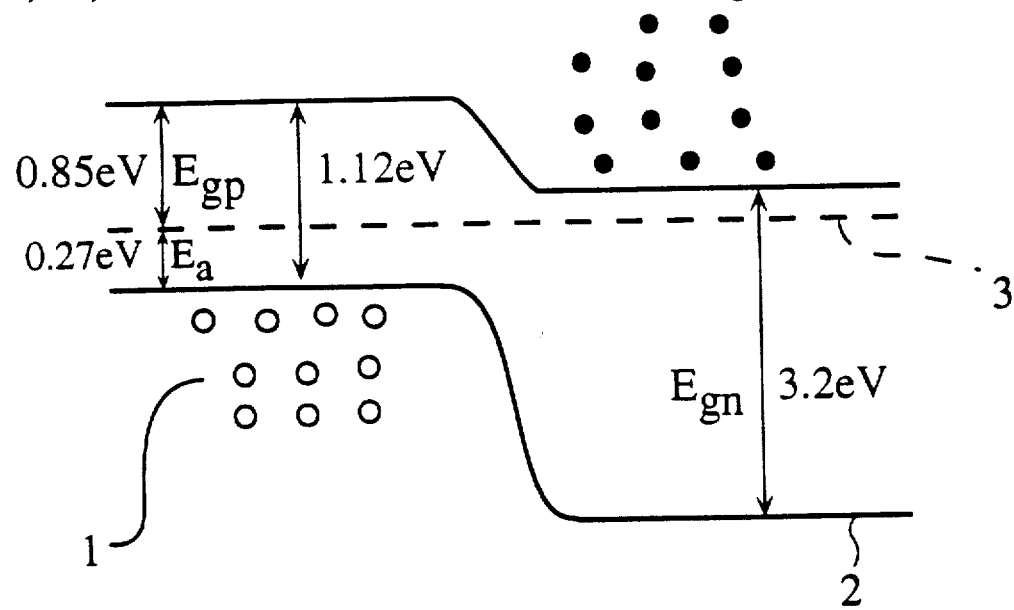
Figure 3:
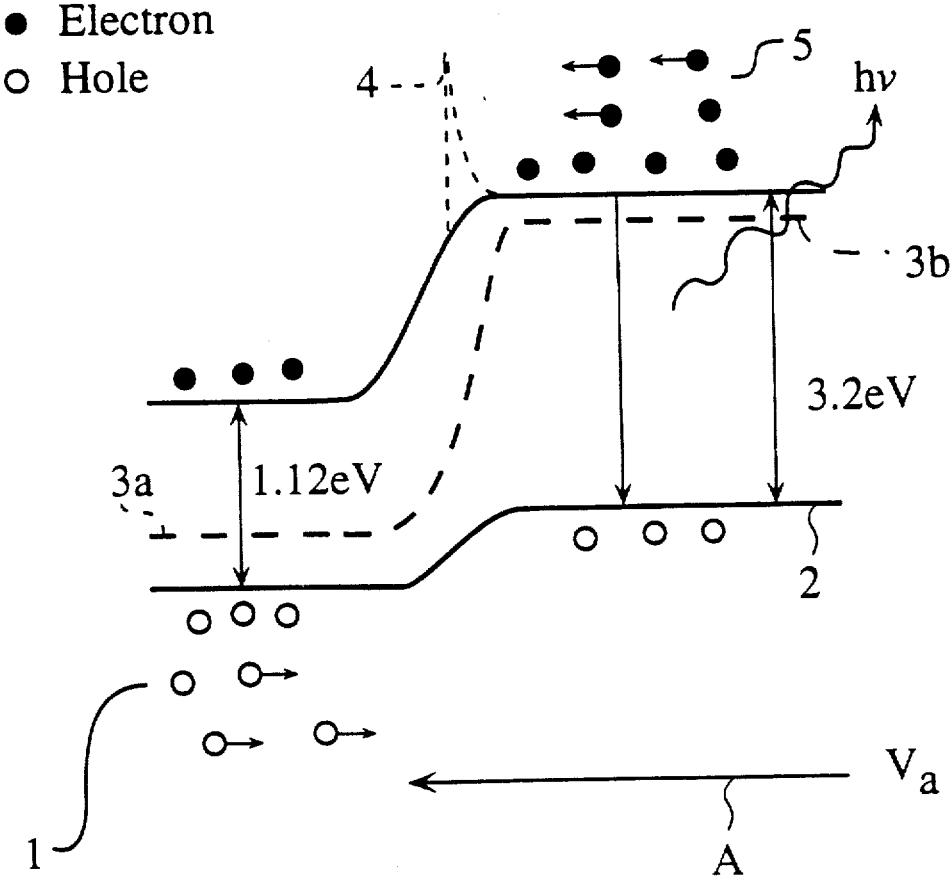

In what follows, an embodiment of the present invention is explained in detail by way of FIGS. 1-3 but the present invention is not intended to be limited by this particular example. In FIG. 1 which shows the structure of an element for a blue light emitting display having a hetero p-n type light emitting layer, numeral 1 indicates a p-type aSiGe:H type alloy (hereinafter referred to aSiGeB), numeral 2 indicates n-type ZnO, numerals 31 and 32 indicate electrodes of an InGa alloy layer, numerals 41 and 42 indicate soldering layers, and numerals 51 and 52 indicate lead lines. A p-n junction between aSiGeB 1 and n-type ZnO 2 is shown in FIG. 2 with the Fermi levels 3 of the p and n parts matching each other. In FIG. 2, $E_a$ indicates the width of the acceptor level of aSiGeB 1, $E_{gp}$ indicates the width of the bandgap and $E_{gn}$ indicates the bandgap of n-type ZnO 2. FIG. 3 shows the energy band when a voltage $V_a$ is applied in the normal direction with the p-part in the positive direction and n-part in the negative direction. In this situation, the Fermi level $3a$ of the p-part is higher than the Fermi level $3b$ of the n-part.

Highly electroconductive aSiGeB 1 is produced by adding about 20 mol % of boron (B) to aSiGe:H and is of p-conduction type. Its conductivity is very high and reaches $10^3 \text{scm}^{-1}$ (resistance = $10^3 \Omega \text{cm}$). The carrier number of aSiGeB 1 is very large and aSiGeB exhibits a metal-like conductivity characteristic. As for n-type ZnO 2, its energy gap $E_{gn}$ is 3.2eV and forms a Schottkey barrier 4 (shown by broken line in FIG. 3), there being generally a large number of levels at the junction surface.

Next, a method of producing a hetero p-n type light emitting layer is described. With reference to FIGS. 1 and 2, single crystalline ZnO was purchased in the form of a boule of dimensions about 5 mm $\times$ 5 mm $\times$ 7 mm having a length of 7 mm in the direction of the C-axis. Its impurity concentration was unknown but electroconductivity believed to be due to oxygen deficiency or impurities was about $10 \Omega$ between the edges in the longitudinal direction. To start, a surface perpendicular to the C-axis was opened by mechanical cleaving to obtain a ZnO single crystal 2 of about 2 mm in width in the direction of the C-axis. On this axis, the aSiGeB film 1 was formed to a thickness of several tens of $\mu$m by a plasma chemical vapor deposition (PCVD) method. For this purpose, only this cleaved surface was opened to plasmas, the other surfaces being covered with aluminum foil. This was set on the electrode of a volume-bonding type small PCVD device and a mixture of $GeH_4$, $SiH_4$ and $B_2H_6$ at the following ratio was introduced into the reaction chamber as source gas at 0.3 torr and at a substrate temperature of about 200° C. The film of aSiGeB 1 was formed by supplying high-frequency power of 13.56 MHz and 100 W for about one hour. The mixing ratio of source gas was $B_2H_6/(SiH_4+GeH_4) = 1 \times 10^{-2}$ and $GeH_4/(SiH_4+GeH_4) = 5 \times 10^{-1}$.

After the light emitting layer is thus formed, electrodes 31 and 32 were formed by an InGa alloy both on the aSiGeB film 1 and the opposite surface of the ZnO crystal 2 and lead lines 51 and 52 were connected through solder layers 41 and 42 to complete a blue light emitting display element. A DC voltage of 5 V was applied to this element and a current of about 1A was observed to flow therethrough. Observed by naked eyes inside a dark chamber, bluish white light emission was noted at the boundary surface.

The principles of light emission is explained next. As shown in FIG. 3, a Schottkey barrier 4 is generally formed by the junction surface levels of the n-type ZnO 2 at the junction surface. Since aSiGeB 1 has a metal-like conductivity characteristic by temperature change, having a high carrier density to form a hetero junction with the n-type ZnO n, the barrier 4 becomes very thin, if a voltage $V_a$ is applied in the normal direction shown by the arrow A in FIG. 3, inversely proportional to the density of conduction electrons. On the other hand, the number of local levels in aSiGeB 1 may be considered as large as $10^{19} - 10^{20} \text{cm}^{-3} \text{eV}^{-1}$ but these local electrons overlap to form a Fermi gas by the so-called Anderson transition, becoming non-local to exhibit metal-like conductivity characteristic. As a result, the junction surface shows the characteristic of an ohmic contact, the carriers passing through the barrier 4 by the tunnel effect.

If, for example, the voltage $V_a$ is greater than $(E_{gn} - E_a)/e$ where e indicates the electronic charge, it may be believed that holes are injected from the p-area of aSiGeB 1 into the n area of ZnO 2 while electrons are injected from the n-area to the p-area. If these holes injected into the n-area are recombined with the electrons in the conduction band 5 of ZnO 2, light $h\nu = (E_{gn} - E_a)$ of bluish white is emitted.

In summary, since a hetero p-n junction type light emitting layer was formed between aSiGeB 1 and ZnO 2 according to this embodiment of the present invention, a substantially ohmic contact was formed and the width of the barrier 4 could be reduced such that carriers could pass the barrier 4 by the tunnel effect and a small number of carriers could be injected. Monochromatic light emission by recombination was thereby achieved.

The foregoing description of a preferred embodiment of the invention has been presented for purposes of illustration and description. It is not intended to be exhaustive or to limit the invention to the precise form disclosed and many modifications and variations are

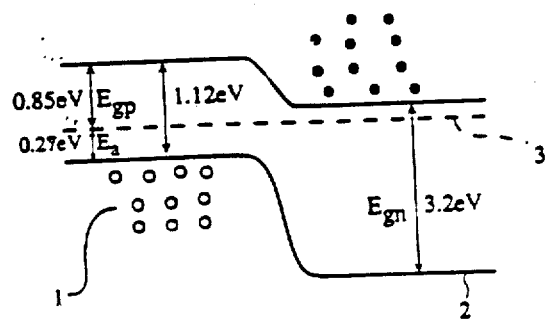

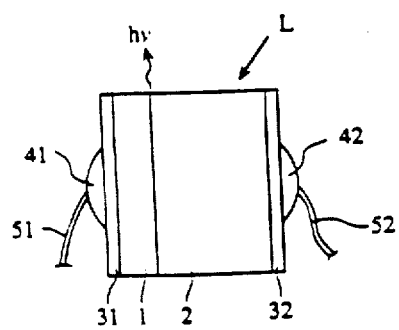

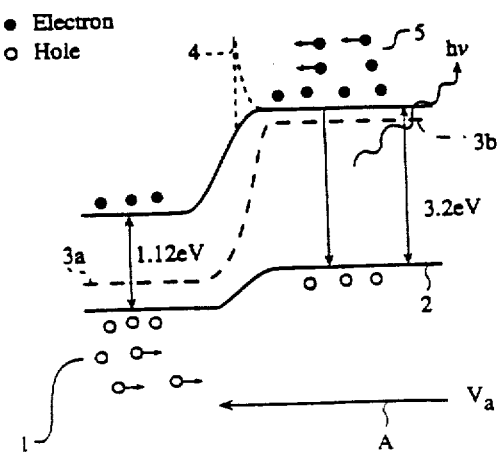

What is claimed is:

1. A blue light emitting diode consisting essentially of:
   a semiconductor layer of a first conduction type composed of a II-VI or III-V semiconducting compound having a wide energy bandgap;
   a highly electroconductive amorphous silicon type semiconductor layer of a second conduction type stacked on said semiconductor layer of a first conduction type, said first and second conduction types being different, said semiconducting compound and said amorphous silicon type semiconductor layer being able to form a p-n junction therebetween;
   a first electrode formed on said amorphous silicon type semiconductor layer of a second conduction type; and
   a second electrode formed under said semiconductor layer of a first conduction type.

2. The diode of claim 1 wherein said semiconductor layer of a first conduction type comprises ZnO.

3. The diode of claim 1 wherein said semiconductor layer of a first conduction type comprises ZnS.

4. The diode of claim 1 wherein said semiconductor layer of a first conduction type comprises ZnSe.

5. The diode of claim 1 wherein said semiconductor layer of a first conduction type comprises GaN.

6. The diode of claim 1 wherein said semiconductor layer of a first conduction type comprises AlN.

7. The diode of claim 1 wherein said semiconductor layer of a first conduction type comprises AlP.

8. The diode of claim 1 wherein said amorphous silicon type semiconductor layer comprises an aSi:H alloy selected from the group consisting of aSiGe:H, aSi:H, aSiN:H and aSi$_{1-x}$C$_x$:H.

9. The diode of claim 1 wherein said amorphous silicon type semiconductor layer is of p conduction type and is selected from the group consisting of aSiGeB:H, aSi:H(B), aSiN:H(B) and aSi$_{1-x}$C$_x$:H(B).

10. The diode of claim 1 wherein said amorphous silicon type semiconductor layer has conductivity of $10^{-3}\Omega$cm or less.

11. The diode of claim 1 wherein said first and second electrodes comprise an InGa alloy.

12. The diode of claim 1 further including soldering layers formed on the surface of said first and second electrodes distal from said semiconductor layers for connecting said first and second electrodes to lead lines.

* * * * *

UNITED STATES PATENT AND TRADEMARK OFFICE
CERTIFICATE OF CORRECTION

PATENT NO. : 5,097,298

DATED : March 17, 1992

INVENTOR(S) : Shaw EHARA

It is certified that error appears in the above-identified patent and that said Letters Patent is hereby corrected as shown below:

ON THE TITLE PAGE:

Please correct Figure 3, both in the Figure itself and on the cover page of the patent as follows:

Please correct "11.12eV" to read --1.12eV--.

Signed and Sealed this

Thirty-first Day of August, 1993

*Attest:*

BRUCE LEHMAN

*Attesting Officer*     *Commissioner of Patents and Trademarks*

United States Patent [19]

Ehara

[11] Patent Number: 5,097,298
[45] Date of Patent: Mar. 17, 1992

[54] BLUE LIGHT EMITTING DISPLAY ELEMENT

[75] Inventor: Shaw Ehara, Nara, Japan

[73] Assignee: Sharp Kabushiki Kaisha, Osaka, Japan

[21] Appl. No.: 620,455

[22] Filed: Nov. 30, 1990

Related U.S. Application Data

[63] Continuation of Ser. No. 384,868, Jul. 21, 1989, abandoned, which is a continuation of Ser. No. 224,663, Jul. 27, 1988, abandoned.

[30] Foreign Application Priority Data

Aug. 5, 1987 [JP] Japan .................. 62-195635

[51] Int. Cl.⁵ .................. H01L 29/14; H01L 31/06
[52] U.S. Cl. .................. 357/17; 357/2; 357/16; 357/10; 357/61
[58] Field of Search .................. 357/2, 16, 17, 61, 59, 357/10

[56] References Cited

U.S. PATENT DOCUMENTS

| | | | |
|---|---|---|---|
| 3,207,939 | 9/1965 | Mason | 357/17 |
| 3,330,983 | 7/1967 | Cusano et al. | 357/17 |
| 3,488,542 | 1/1970 | Lehrer et al. | 357/17 |
| 3,683,240 | 8/1972 | Pankove | 357/17 |
| 4,081,764 | 3/1978 | Christmann et al. | 357/10 |
| 4,409,605 | 10/1983 | Ovshinsky et al. | 357/2 |
| 4,650,558 | 3/1987 | Frank | 204/242 |

FOREIGN PATENT DOCUMENTS 0096509  12/1983  European Pat. Off. .......... 357/17

Primary Examiner—Jerome Jackson, Jr.
Attorney, Agent, or Firm—Morrison & Foerster

[57] ABSTRACT

A blue light emitting display element has a hetero p-n junction type light emitting layer formed between a semiconductor layer of a II-VI or III-V semiconducting compound having a wide energy bandgap and a highly electroconductive amorphous silicon type semiconductor layer which is of opposite conduction type and capable of forming a substantially ohmic contact with the semiconducting compound.

12 Claims, 2 Drawing Sheets